United States Patent
Pakonen et al.

(10) Patent No.: US 6,448,782 B1
(45) Date of Patent: Sep. 10, 2002

(54) ARRANGEMENT AND METHOD FOR DEFINING THE LOCATION OF SOURCE OF PARTIAL DISCHARGES

(75) Inventors: Pertti Pakonen, Tampere; Mats Björkqvist, Vaasa; Vesa Latva-Pukkila, Tampere, all of (FI)

(73) Assignee: ABB Substation Automation Oy, Vaasa (FI)

( * ) Notice: Subject to any disclaimer, the term of this patent is extended or adjusted under 35 U.S.C. 154(b) by 0 days.

(21) Appl. No.: 09/690,308

(22) Filed: Oct. 17, 2000

(30) Foreign Application Priority Data

Oct. 19, 1999 (FI) ............................................. 19992261

(51) Int. Cl.$^7$ ................................................ G01R 31/08
(52) U.S. Cl. ...................... 324/536; 324/532; 324/523; 324/533
(58) Field of Search ................................. 324/523, 528, 324/532, 535, 536, 533, 534, 551; 702/58

(56) References Cited

U.S. PATENT DOCUMENTS 3,991,364 A * 11/1976 Wiznerowicz .............. 324/533
5,416,418 A * 5/1995 Maureira et al. ........... 324/535
6,161,077 A * 12/2000 Fawcett ....................... 324/523

* cited by examiner

Primary Examiner—N. Le
Assistant Examiner—James Kerveros
(74) Attorney, Agent, or Firm—Michael M. Rickin, Esq.

(57) ABSTRACT

A method and an arrangement (300, 400) for determining the location of partial discharge sources in an electric system, the method includes the steps of measuring a variable of the electric system, such as voltage or current, to which partial discharges occurring in the electric system cause pulses, separating the pulses caused by partial discharges, i.e. partial discharge pulses, and occurring in the measured variable, defining (301) one or more characteristic parameters depicting the properties of partial discharge pulses for each partial discharge pulse after at least a predefined number of partial discharge pulses has been obtained, and determining (302) the location of the partial discharge source by placing (302) the obtained characteristic parameters in a model formed in advance, which depicts the dependency of the values of the characteristic parameters from the distance between the partial discharge source and the measuring point where the characteristic parameters have been defined on the basis of the measured variables.

17 Claims, 13 Drawing Sheets

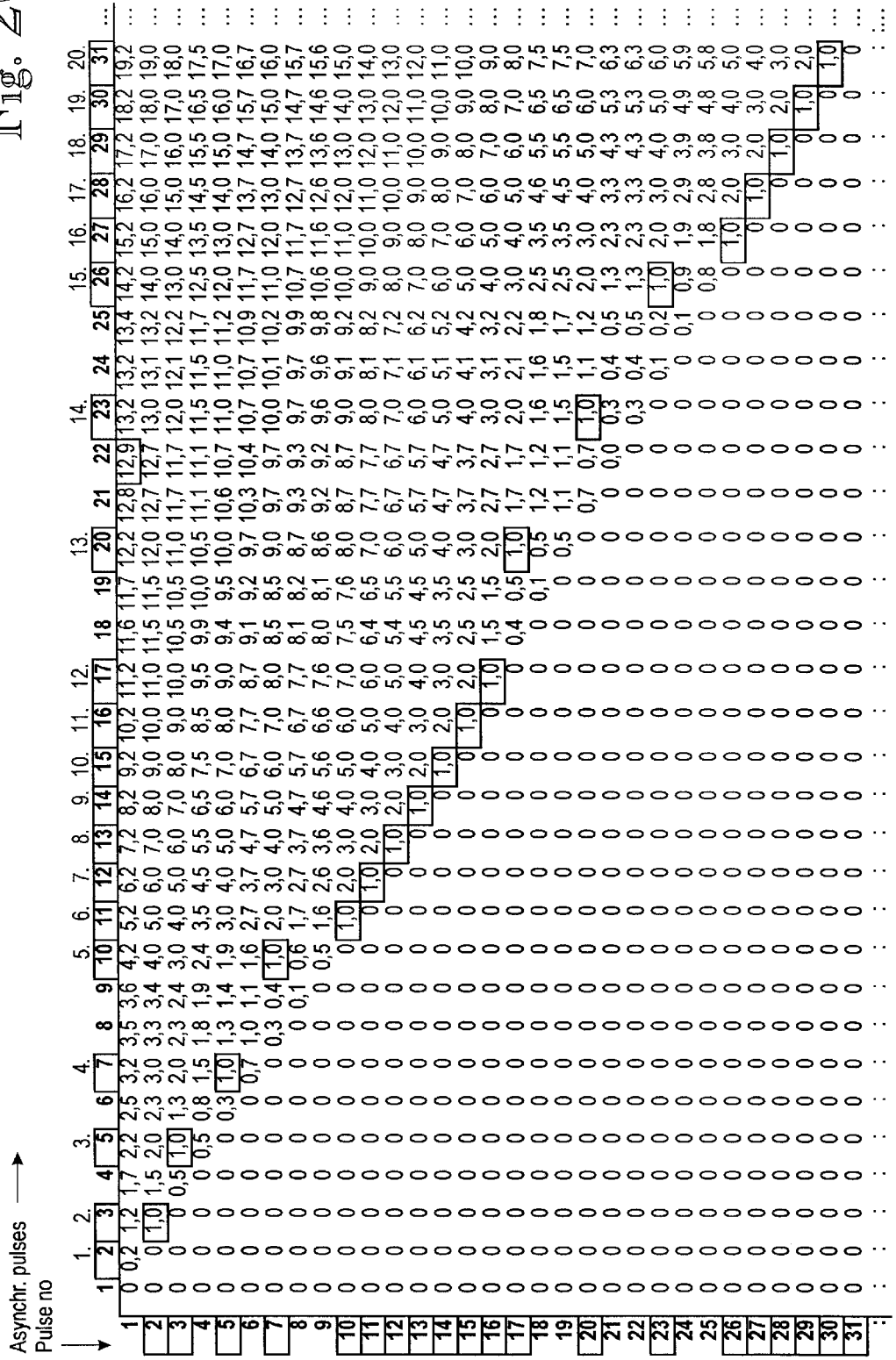

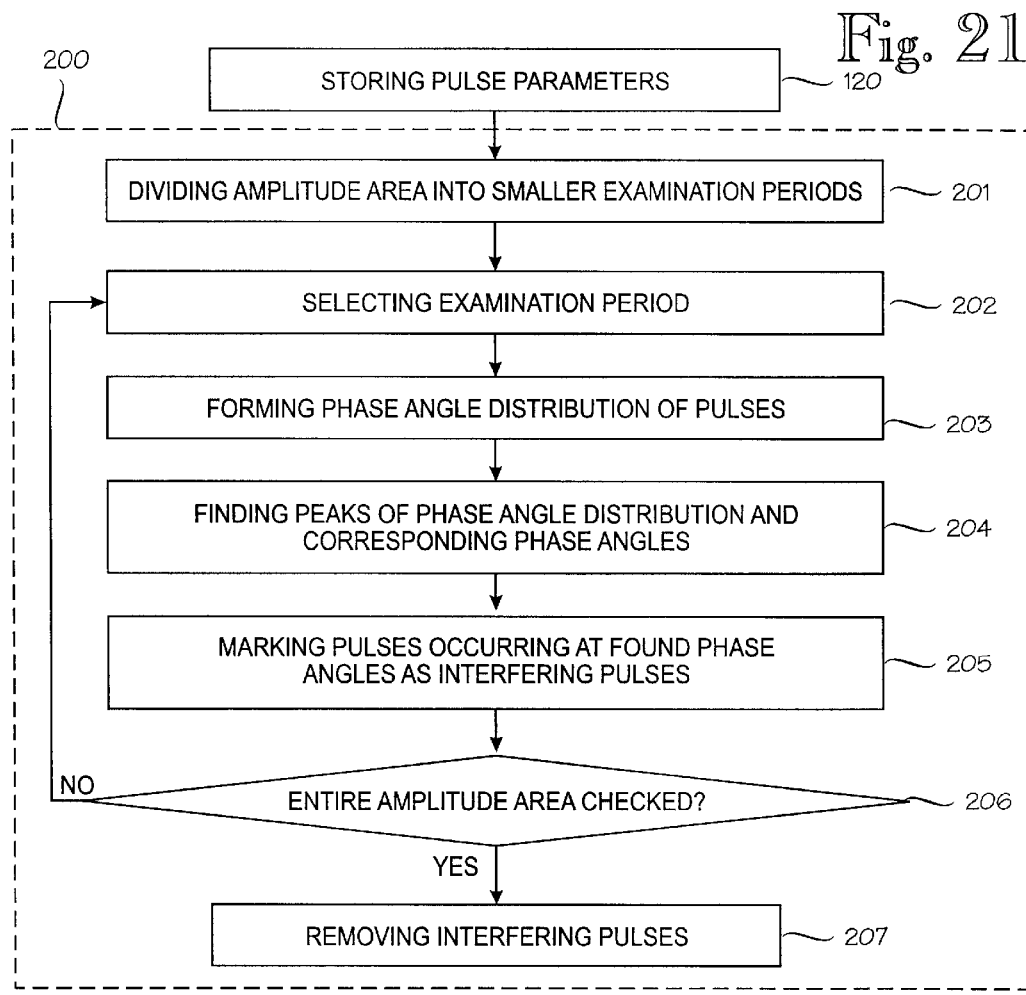
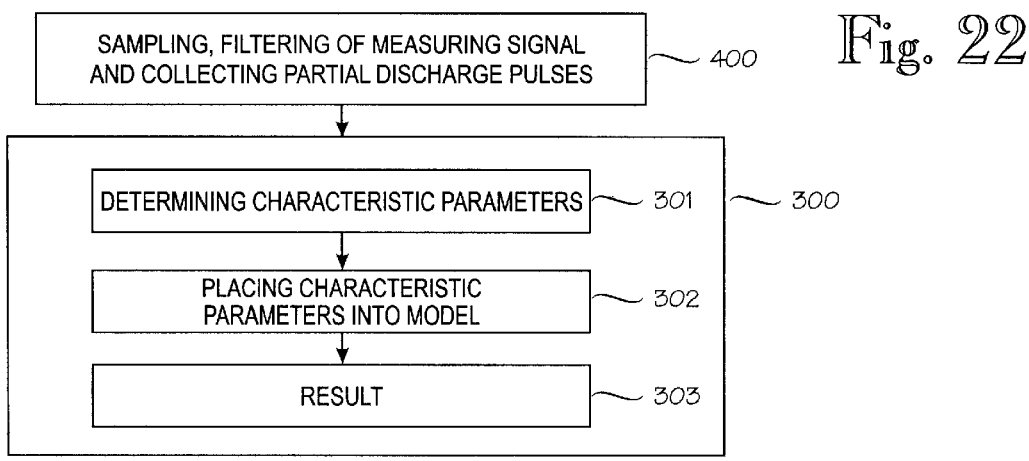

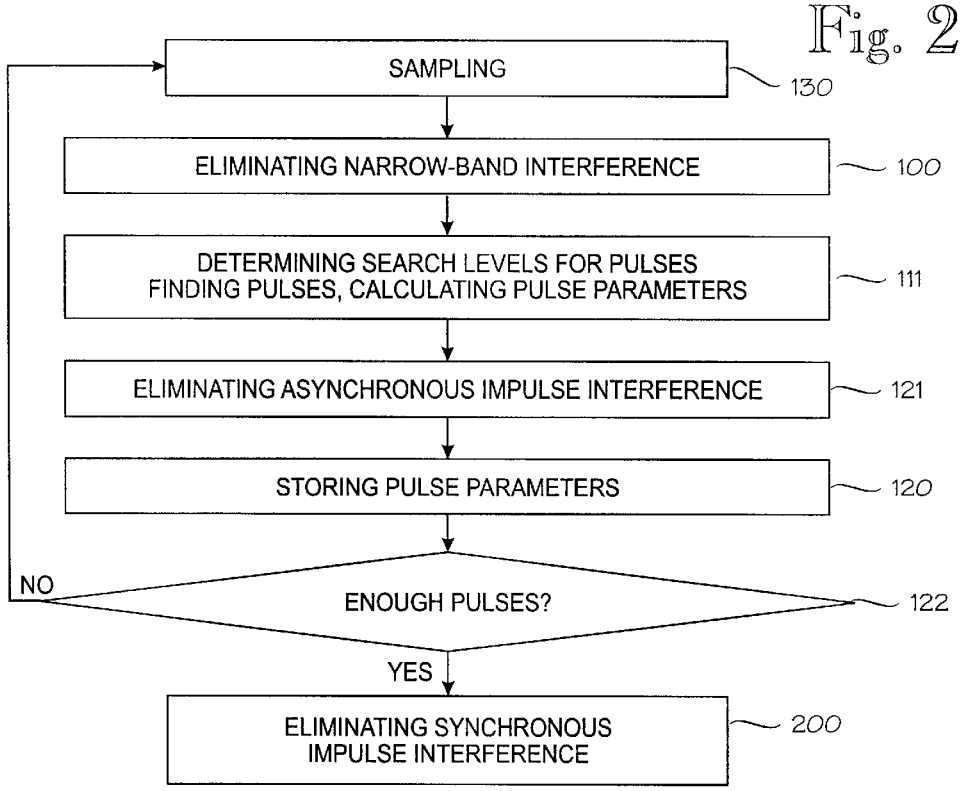
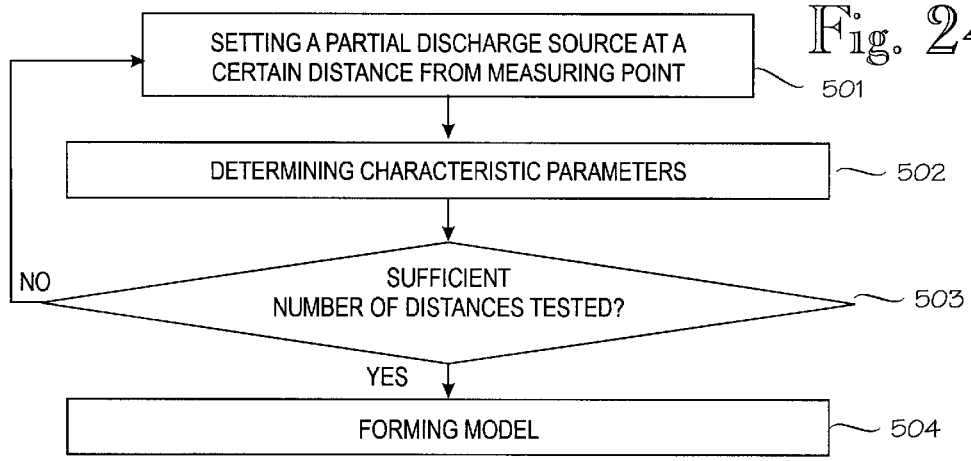

ARRANGEMENT AND METHOD FOR DEFINING THE LOCATION OF SOURCE OF PARTIAL DISCHARGES

BACKGROUND OF THE INVENTION

The invention relates to a method and arrangement for determining the location of partial discharge sources in an electric system.

The voltage strength of an insulating structure refers to its ability to endure voltage stress without electric discharges that cause disturbances or damage. If the voltage stress in an the insulating structure is increased sufficiently, discharges occur which make the insulation completely or partially conductive. The latter are called partial discharges. A partial discharge does not unite the electrodes and, thus, the insulating properties of the insulating material do not completely disappear. Partial discharges do, however, wear the insulating material and thus further weaken: its voltage strength and may finally lead to a complete electric discharge. Partial discharges can be divided into two main groups, internal and external discharges. Internal discharges comprise cavity discharges and external discharges comprise surface, corona and spark discharges. Each group can further be divided into several subgroups which are often difficult to clearly distinguish from each other. Partial discharge pulses are very fast pulses and usually occur as pulse groups. A partial discharge and the reversal of charge that occurs in connection with it show as a current pulse in the connectors of the insulating material. In practice, these current pulses also Sum into the phase voltage of the system.

Locating partial discharge sources quickly in an electric system is important for preventing the occurrence of a more serious defect. Detecting partial discharges in electric networks and locating the discharge source has usually required an analysis of measuring data by a person skilled in the art. There are also methods for determining the location of the discharge source automatically.

Published application WO 93/17351, for instance, discloses a method of locating partial discharges in a cable, based on the use of a measuring sensor and device. The measuring device measures the partial discharge pulse coming directly to the sensor from the fault location and the partial discharge pulse from the fault location reflected to the sensor from the other end of the cable. The location of the discharge in the cable is determined on the basis of the time difference of the pulses. The method is called a TDR (time domain reflectometry) method.

Published application CA 2119702 discloses a method of determining the location of partial discharges in a cable without methods based on pulse reflections (TDR methods) or communication between sensors. The method is based on using two sensors installed close to the ends of the cable, for instance. The first sensor measures on one side of the fault location the partial discharge pulse coming directly from the fault location, which pulse is called the first pulse. The second sensor measures on the other side of the fault location the partial discharge pulse coming directly from the fault location, which pulse is called the second pulse. Immediately after detecting the second pulse, a third pulse which can be measured with the first sensor is sent to the cable. By calculating the time difference between said first and third pulse, it is possible to determine the location of the discharge point.

A drawback with the prior art disclosed in published application WO 93/17351 is that it may function poorly if the cable section is long or has high attenuation or if there is a lot of interference in the environment. This is caused by the fact that in the worst case, the reflected pulse needs to propagate a distance of almost twice the length of the cable and attenuates too much to be measurable. In other words, if the locating is to work in all situations, the length of a cable section covered by one measuring point remains at approximately half of what would be possible with another method not based on measuring pulse reflection.

A drawback with the prior art disclosed in published application CA 2119702 is that especially in conditions having interference, the amplitude of the reference pulse (third pulse) fed through the sensor to the cable must be high enough, which may cause problems in implementing the sensor and the pulse generator, and consequently, their price becomes easily unreasonably high. If the sensor is designed adequate with respect to measuring sensitivity and advantageous in price, its voltage division ratio will not be suitable to feeding a sufficiently strong reference pulse to the cable.

BRIEF DESCRIPTION OF THE INVENTION

It is thus an object of the invention to develop a method and a system implementing the method so as to solve the above-mentioned problems. The object of the invention is achieved by a method and system characterized in what is stated in the independent claims 1 and 8. Preferred embodiments of the invention are disclosed in the dependent claims.

The invention is based on the fact that the properties of partial discharge pulses generated in a partial discharge source change as a function of distance when they propagate in the electric system along a conductor, for instance. By deriving characteristic parameters depicting certain properties of partial discharge pulses from measured partial discharge pulses and by placing them in a model formed in advance, for instance experimentally, which describes the change of the characteristic parameters as a function of distance substantially at the frequencies where partial discharge pulses occur, it is possible to determine the distance of a partial discharge source from the measuring point at a certain accuracy.

The method and arrangement of the invention provide the advantage that by means of the invention, it is possible to automatically detect and locate with a certainty and accuracy partial discharge sources occurring in an electric system. In addition, the invention can easily be applied to monitoring different apparatuses and environments by changing the used model to correspond to the system to be monitored. Further, the method and system of the invention does not require additional equipment in addition to the measurement of partial discharge pulses made at one point.

BRIEF DESCRIPTION OF THE FIGURES

In the following, the invention will be described by means of preferred embodiment and with reference to the attached drawings in which FIG. 21 shows a block diagram of a method of eliminating synchronous impulse inference, FIG. 22 shows a block diagram of a system of the invention according to an embodiment thereof, FIG. 23 shows a block diagram of a sampling, measuring signal filtering and partial discharge pulse collection block according to an embodiment thereof, FIG. 24 shows a flow chart of forming a mathematical model used in determining the location according to an embodiment.

DETAILED DESCRIPTION OF THE INVENTION

Figure 1:
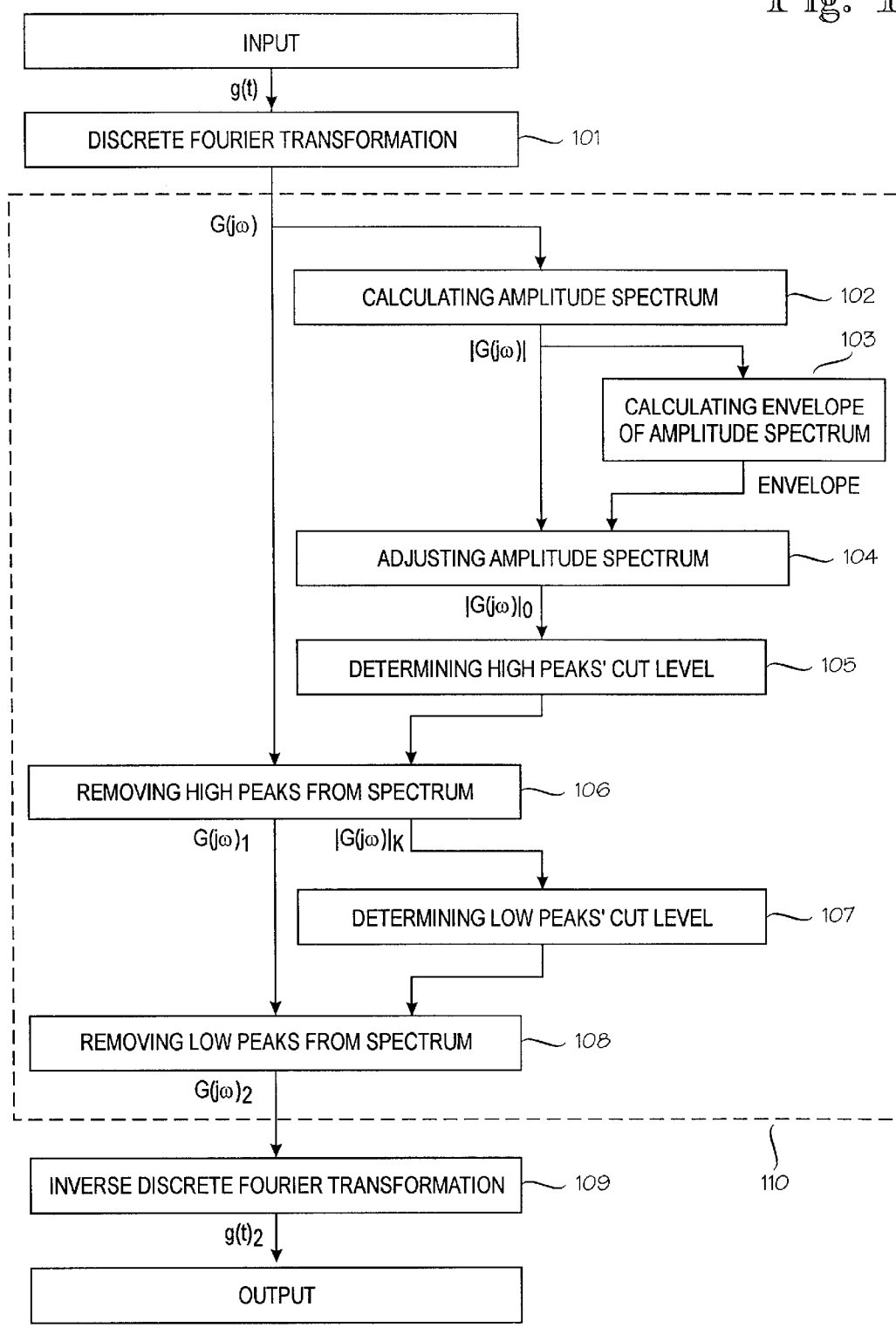
FIG. 1 shows a block diagram of a method of eliminating narrow-band interference.

A block diagram of a method and system of the invention is shown in FIG. 22. The invention can be divided into two main blocks: sampling, measuring signal filtering and partial discharge pulse collection 400 and partial discharge pulse analysis 300. FIG. 22 also shows the operation of the analysis block 300 illustrated by means of a flow chart. The use of the method and system of the invention is not limited to any specific system, but they can be used in connection with various electric systems, such as electric networks or apparatuses, to determine the location of partial discharge sources possibly occurring in them. The arrangement of the invention can be implemented by means of digital signal processing equipment, for instance.

FIG. 23 shows a flow chart illustrating the operation of the sampling, measuring signal filtering and partial discharge pulse collection block 400 according to an embodiment thereof. In the method, a high-frequency voltage (or another variable from which partial discharge pulses can be distinguished) occurring in an electric network is preferably continuously digitised during several network cycles. The used measurement method bears no significance to the basic idea of the invention and depends, for instance, on the electric system being examined. The lower limiting frequency $f_l$ is a few tens of kilohertz, for instance, and the upper limiting frequency $f_u$ is several megahertz, for instance (e.g. $f_l \approx 60$ kHz and $f_u \approx 8$ MHz). The digitising results 130 at a sampling frequency of 16 MS/s, for instance, in a total of 960,000 samples during three network cycles. This three-cycle packet is in the following called a measurement and it is also the input data of an algorithm. The algorithm preferably eliminates 100, 121, 200 interfering signals from the measurement using digital filtering, for instance. The algorithm picks partial discharge pulses from the sample string remaining in the measurement. From the pulses, the algorithm calculates 111 for instance the following parameters depicting the pulse form: rise time of the pulse (preferably 10 to 90% points), fall time of the pulse (preferably 90 to 10% points), width of the pulse (preferably at a height of 50%). Which pulse parameters are defined at this stage depends on the characteristic parameters to be used later in the analysis stage. The above-mentioned pulse parameters are stored 120 for each pulse for analysis.

Alternatively, it is possible to store the following information, for instance, on each pulse: 50 to 100 sample points of each pulse, the starting phase angle of the pulse, the sequence number of the network cycle (where the pulse occurred) and the time stamp of the starting time of the network cycle (where the pulse occurred). In this alternative case, the pulse parameters mentioned earlier are calculated only in the analysis block 300.

It should be noted that the filtering of the measuring signal and the collection of the partial discharge pulses can also be performed utilising other methods without this having any significance with respect to the basic idea of the invention. It is also possible that only a: part of the presented filtering methods are used or that no filtering is needed, if the system being examined is protected against external interference.

One interference type related to partial discharge measurements is narrow-band interference. Narrow-band interference refers to interfering signals whose spectrum is narrow, i.e. the energy of the signal is concentrated on a narrow frequency range. Various radio transmitters and communications equipment operating on a narrow frequency range typically cause narrowband interference. This type of interference may mask weak partial discharge pulses, thus weakening the sensitivity of the partial discharge measurement. Another interference type related to partial discharge measurements is asynchronous impulse interference which is a pulse-form interference and does not occur synchronously with a phase voltage (nominal frequency, e.g. 50 or 60 Hz), in other words, in consecutive phase voltage cycles, the pulses do not occur at the same phase angles. The time between consecutive interfering pulses remains almost constant, however. Commutating pulses of an inverter are a typical example of asynchronous impulse interference. A third interference type related to partial discharge measurements is synchronous impulse interference which is a pulse-form interference and occurs synchronously with a phase voltage. Interfering pulses repeat in consecutive cycles at nearly constant phase angles. In addition, the amplitude of the pulses remains nearly constant. Synchronous impulse interference is caused by commutating pulses of rectifiers and phase angle regulation, for instance.

Eliminating narrow-band interference 100

Figure 4:
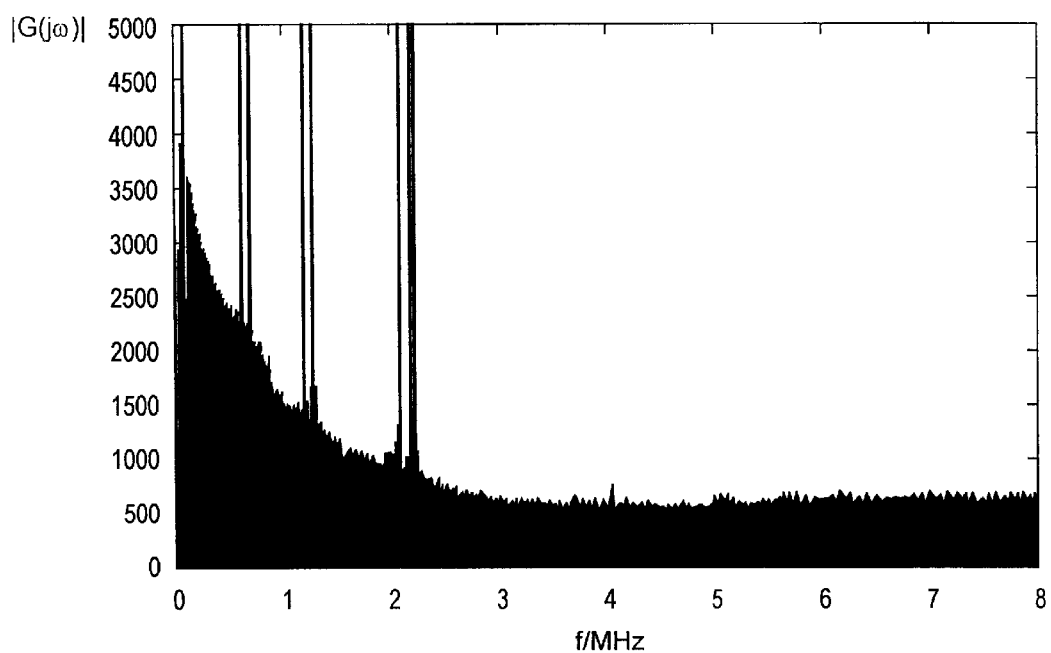
FIG. 4 shows the amplitude spectrum of the exemplary signal scaled in relation to the amplitude.

Narrow-band interference is shown as peaks in the amplitude spectrum. The width of the peak is directly proportional to the width of the interference band. To be able to eliminate narrow-band interference from a signal, one must be able to identify from the amplitude spectrum any peaks occurring in it. The power of partial discharges and noise is evenly distributed along the entire frequency range of the spectrum. The amplitude spectrum of white noise is according to its specification constant on the entire frequency range. With coloured noises, the power is higher on some frequency ranges, but even these cases show as planar areas in the amplitude spectrum. In the tests performed with the measuring system used as an example in the application, the applicant has noticed that the power of partial discharges is distributed along the entire frequency range in the spectrum. Partial discharges do, however, have more power at low frequencies than at high frequencies. For instance FIG. 4, which discloses the amplitude spectrum |G(jω)| of the exemplary signal G(jω) scaled in relation to the amplitude, shows that the power of the partial discharges is higher at the frequency range 0 to 2.5 MHz and at the frequency range 2.5 to 8 MHz, the power is nearly constant. The peaks shown in FIG. 4 are caused by narrow-band interference. Narrow-band interference has in the example of FIG. 4 concentrated on low frequencies, but in practice, they may occur on the entire frequency range.

A block diagram illustrating a method of eliminating narrow-band interference is shown in FIG. 1. The method is based on modifying 110 a finite-length signal in a frequency domain. For this purpose, before the signal is modified, it is transformed 101 from a time domain (g(t), where t is time) to a frequency domain (G(jω), where j is an imaginary unit and ω=2πf, where f is the frequency) in time intervals of suitable length, preferably by Fourier transformation. After the time interval of the signal has been modified, it is returned 109 to the time domain by a reverse Fourier transformation. The examples use a 60 ms-long signal time interval at a 16 MHz sampling frequency, whereby a total of 960,000 sample points are obtained. The length of the signal time interval may differ from the above exemplary value.

Figure 2:
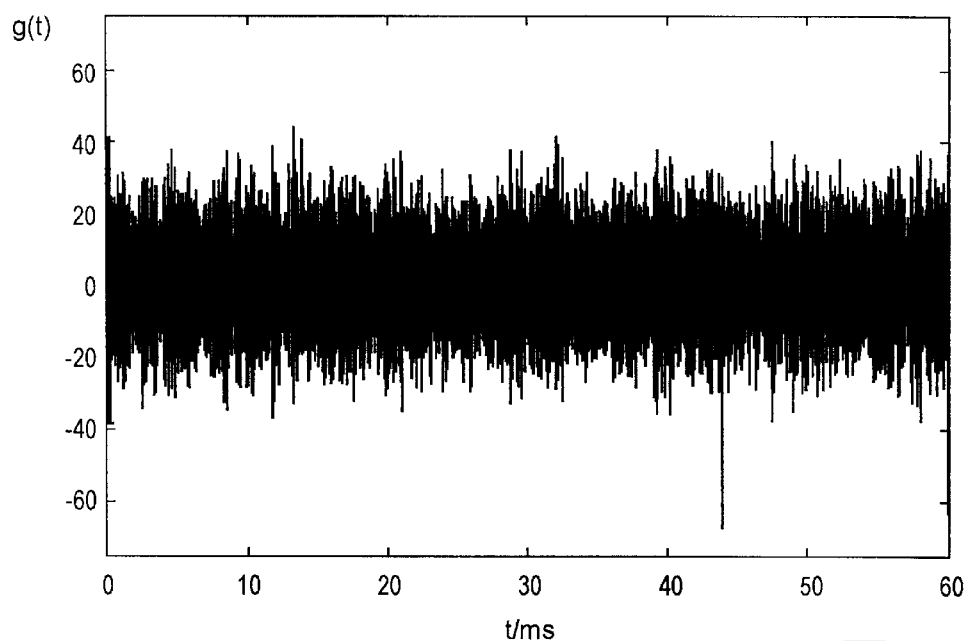
FIG. 2 shows an interfering exemplary signal in a time domain.
Figure 3:
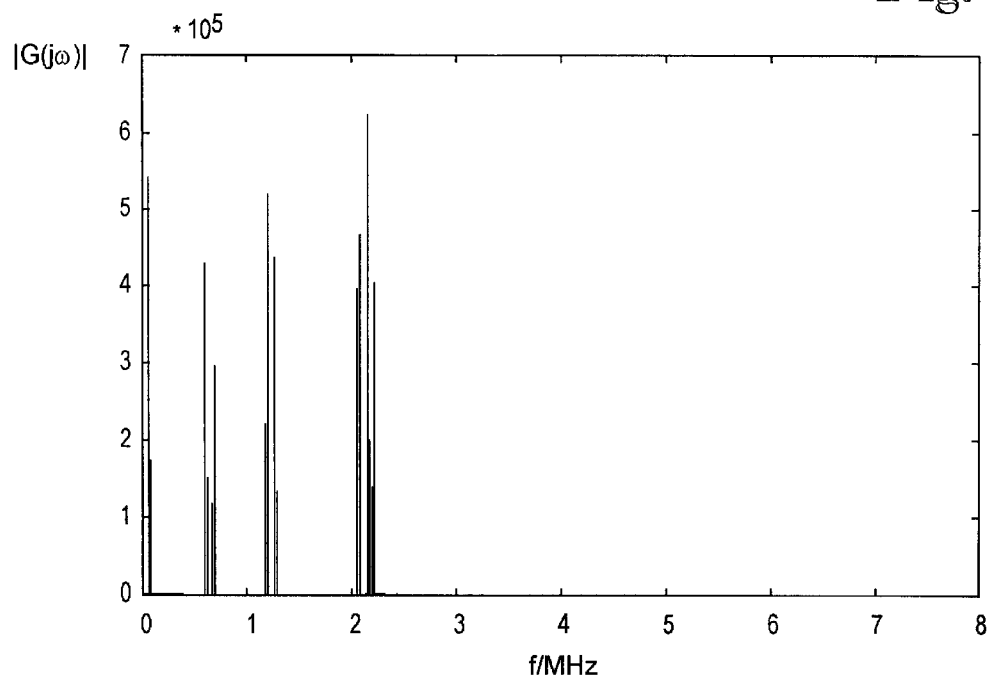
FIG. 3 shows an amplitude spectrum of the exemplary signal.
Figure 5:
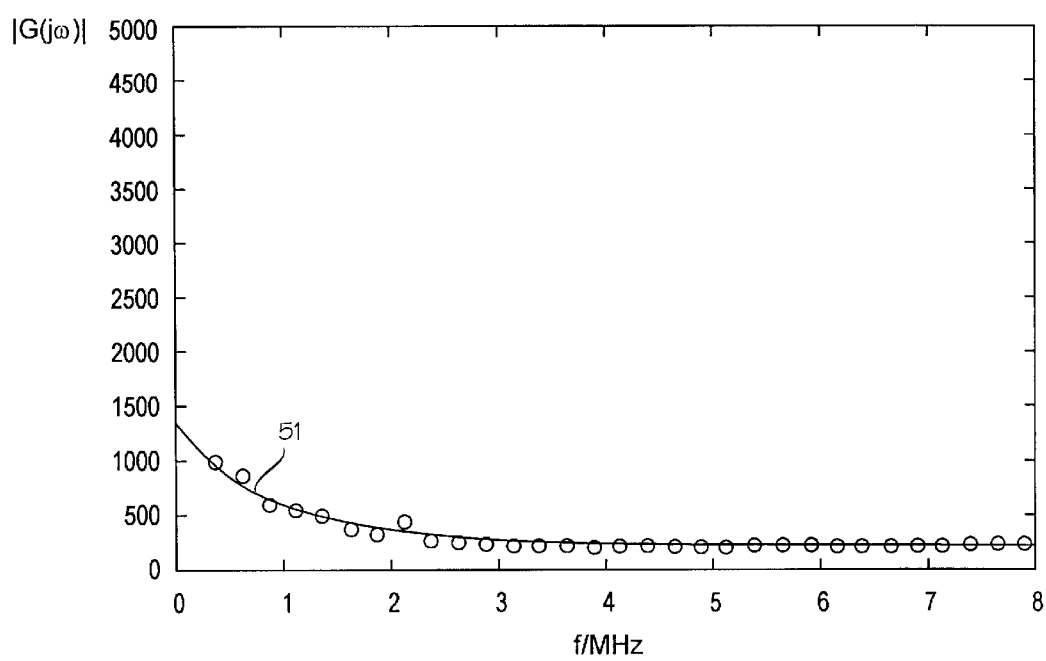
FIG. 5 shows sectional medians of the amplitude spectrum and an envelope adapted to them.

FIG. 2 shows the exemplary signal g(t) in a time domain, wherein the vertical axis depicts the signal amplitude g(t) and horizontal axis the time t. It should be noted that the graphs shown in FIGS. 2 to 10 only describe one exemplary signal and they are intended only to illustrate the operation of a filtering method. The amplitude spectrum |G(jω)| (FIG. 3), which depicts the signal amplitude |G(jω)| (vertical axis) in relation to the frequency f (horizontal axis), is calculated 102 from the Fourier spectrum of the signal transformed into the frequency domain, i.e. the spectrum G(jω). FIG. 4 shows the amplitude spectrum |G(jω)| scaled in relation to the amplitude. If one tries to identify the peaks of narrow-band interference from an amplitude spectrum |G(jω)| like that of FIG. 4, it may happen that a strong power peak of a partial discharge occurring in the frequency range 0 to 1 MHz, for instance, is interpreted as an interference peak. If, due to this, the frequency range 0 to 1 MHz is filtered away completely, a considerable amount of power is removed from the partial discharge signal. This results in the distortion of partial discharge pulses and the filtering result cannot be used. To avoid the above problem, the amplitude spectrum |G(jω)| of the signal is adjusted. The adjustment is done by finding the envelope of a uniform bottom level of the amplitude spectrum. In the case of FIG. 4, the uniform area at the bottom of the amplitude spectrum can be considered the bottom level. Peaks do not belong to the bottom level. For defining the bottom level envelope of the amplitude spectrum, the amplitude spectrum is divided into sections, for instance 32 sections, and a median is defined for each section. The first of the 32 sectional medians is preferably left out, if in sampling, the measuring signal was high-pass filtered to remove the main voltage and harmonics, in which case the median of the first section does not represent the actual form of the envelope. The envelope is obtained 103 by matching to these 31 points (circled values in FIG. 5) for instance an exponential third degree polynome 51 of form $$\text{envelope} = e^{ax^3+bx^2+cx+d},$$

wherein a, b, c and d=coefficients of the polynome,
e=Neper number, and
x=frequency.

Figure 6:
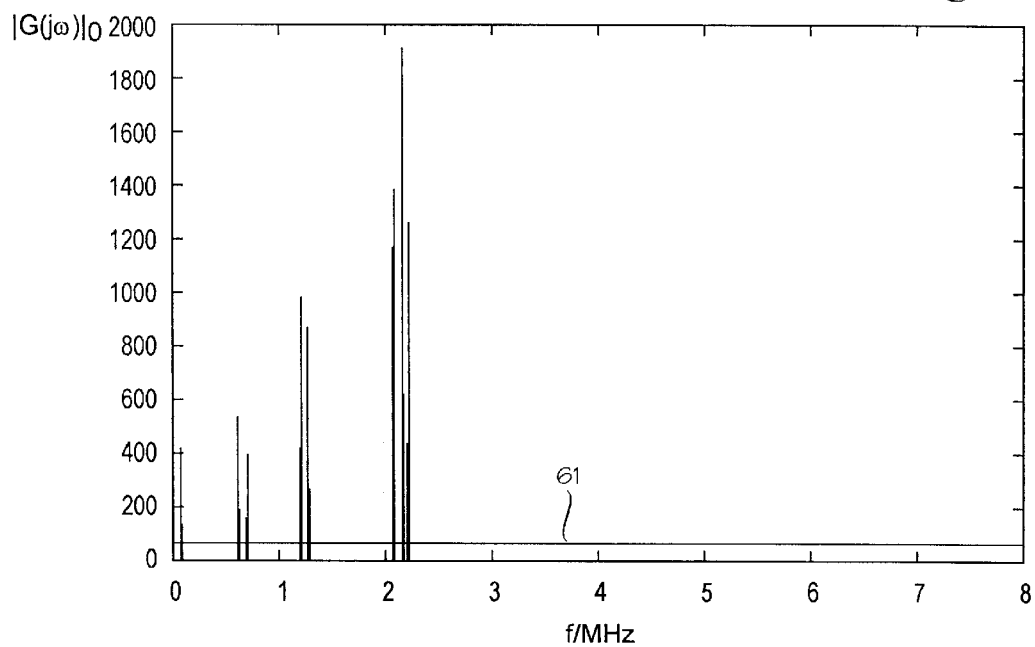
FIG. 6 shows an adjusted amplitude spectrum and a cut level of high peaks.
Figure 10:
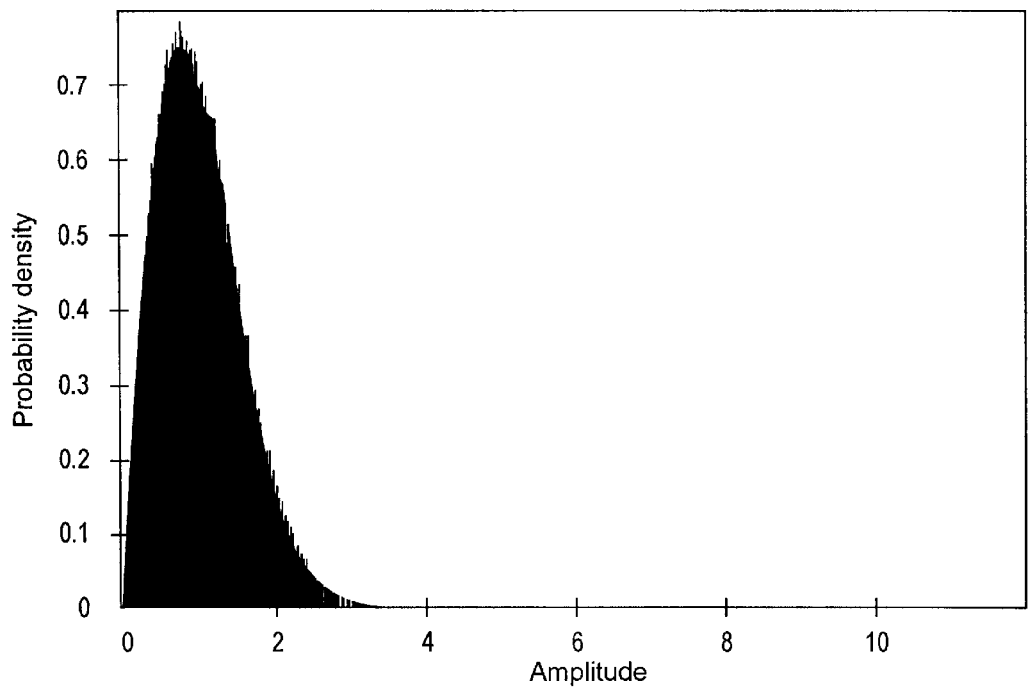
FIG. 10 shows the amplitude distribution of the adjusted amplitude spectrum.

The amplitude spectrum |G(jω)| is. adjusted 104 by dividing it by the envelope values sample by sample. The adjusted amplitude spectrum $|G(j\omega)|_o$ is shown in FIG. 6. In the adjusted amplitude spectrum, the bottom level is nearly constant and the peaks rising from it are narrow-band interference. Narrow-band interference peaks are easy to identify in an adjusted amplitude spectrum, if a bottom level has been defined. A simple solution would be to use a fixed cut level. The strength and density of partial discharges and the power of the background noise, and thus also the power of the entire signal, vary, however, thus also making the height of the bottom level of the amplitude spectrum to vary. When using a fixed cut level, the level should be set so high that one can be absolutely sure of not interpreting the bottom level, and, at the same time, the partial discharges interference. In this case, however, the sensitivity of interference elimination decreases, i.e. some of the interference is not eliminated. The most advantageous solution is to define the cut level case by case. The cut level must be set as low as possible, but clearly above the bottom level, however. An optimal cut level can be defined by means of the average and standard deviation or variance of an adjusted amplitude spectrum, for instance. The amplitude distribution of the adjusted amplitude spectrum is shown in FIG. 10, wherein: the horizontal axis shows the amplitude value and the vertical axis the probability density of the amplitude value. The distribution resembles an $\chi^2$ distribution. There is a formula for an $\chi^2$ distribution, as there is one for a normal distribution, by means of which it is possible to estimate how large a part of the values is within the given limits. For instance, of the values of a normally distributed signal, 95% is within the limits $\mu\pm1,96\sigma$ ($\mu$ is the average and $\sigma$ is the standard deviation). The formula of the $\chi^2$ distribution is in the same form as that of the normal distribution, but the probability limits differ. The cut level level of the spectrum peaks can be defined 105 and 107 by means of the average and standard deviation of the adjusted amplitude spectrum, for instance, by formula $$\text{level} = \text{mean} + \text{coef} \cdot \text{std},$$

wherein
mean=the average of the adjusted amplitude spectrum,
std=the standard deviation of the adjusted amplitude spectrum, and
coef=the coefficient determining the sensitivity of the cut level.

The cutting of the spectrum peaks is most preferably performed in two parts; first the possible high peaks are removed 106 and then the remaining low peaks are removed 108. By performing the cutting in two parts produces an exact and robust result. In addition, this ensures that partial discharges are not attenuated. In other words, the first cutting 106 endeavours to remove the high peaks which strongly affect the standard deviation, in which case, in the second cutting 108, the cut level level can be defined as exactly as possible above the bottom level. In the case of FIG. 10, for instance, an acceptable level value of the second cutting could be between 5 and 15. Alternatively, it is also possible to use only one cutting or more than two. If more than two cuttings were used, an even more exact and robust result would be achieved, but at the same time, the required calculation time would increase. When using only one cutting, the effect of the high peaks on the setting of the cut level is considerable. By a correct selection of the coefficient coef, it is possible to ensure that no filtering is done, if no narrow-band interference exists in the signal. In such a case, the cut levels are set so high that the entire amplitude spectrum remains below them. When defining 105 the cut levels of high peaks, the value coef=4 is preferably used, and when defining 107 the cut levels of low peaks, the value coef=3 is preferably used, when the cutting is done in two parts. Said values of the coefficient coef are based on tests performed by the applicant. Other values can also be used, but the most advantageous value range of the coefficient coef when calculating the first cut level is 3 to 6 and when calculating the second cut level, it is 2 to 4.

Figure 7:
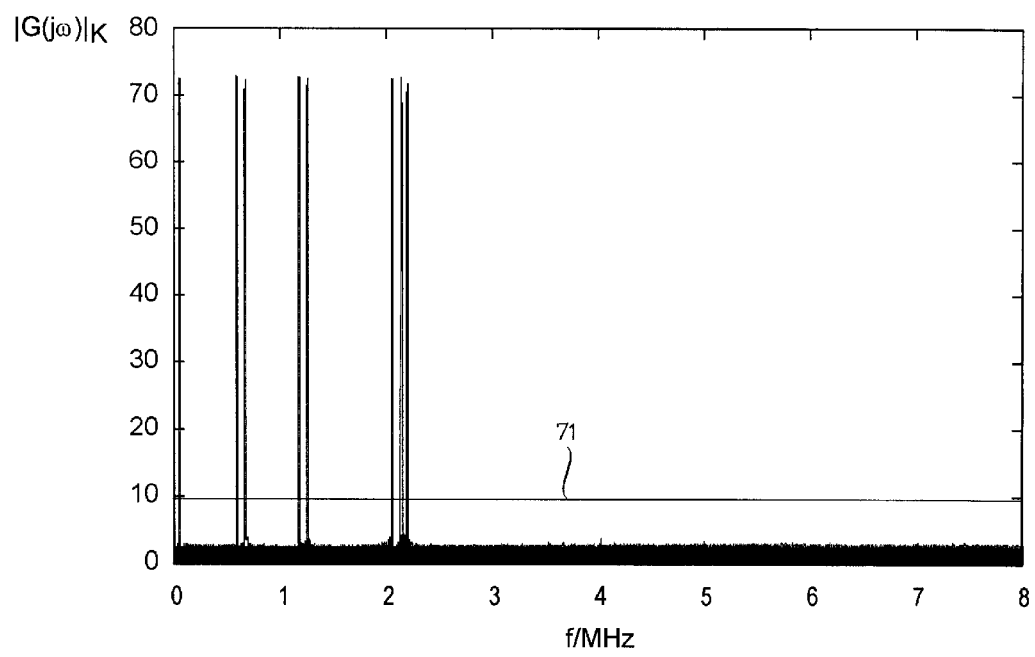
FIG. 7 shows a corrected adjusted amplitude spectrum and a cut level of low peaks.
Figure 8:
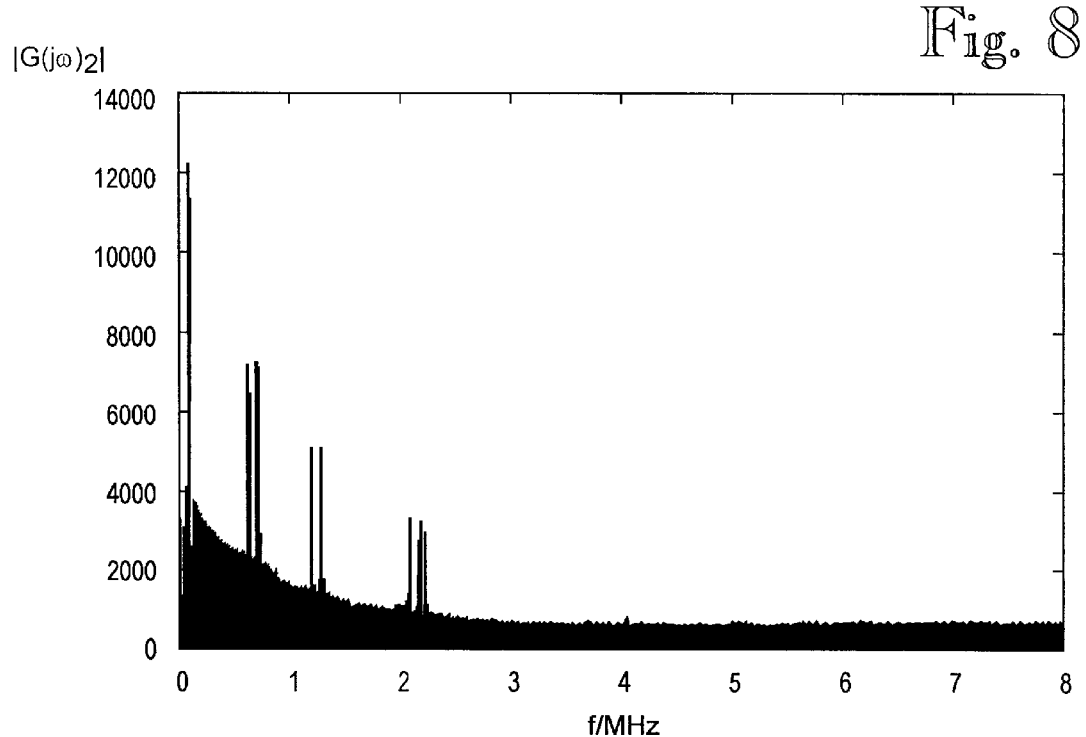
FIG. 8 shows the amplitude spectrum calculated from the corrected spectrum.
Figure 9:
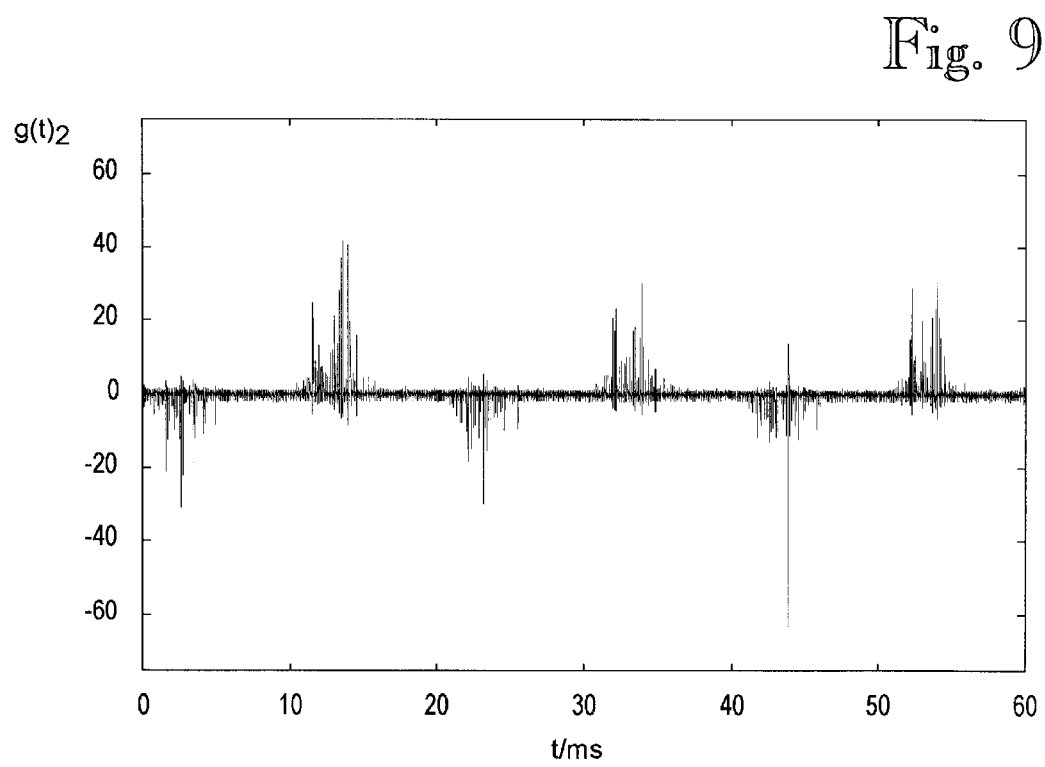
FIG. 9 shows the corrected exemplary signal in a time domain.

Removing the spectrum peaks from the spectrum is done at the first stage in such a manner that the frequency ranges having values exceeding the high peaks cut level 61 in the adjusted amplitude spectrum $|G(j\omega)|_o$ are nulled 106 in the spectrum $G(j\omega)$. Because the spectrum $G(j\omega)$ (like the amplitude spectrum) is discrete in relation to the frequency, i.e. it is made up of frequency samples, the smallest frequency range which can be nulled is a frequency range of the length of one frequency sample. Narrow-band interference does typically not, however, concentrate exactly point by point on one frequency, but may be slightly more widely spread. For instance, the bandwidth of an AM radio transmission including sidebands may be 9 kHz. Thus, the interference may be spread in the area of several frequency samples. Because of this, it may be advantageous that the frequency range to be nulled comprises not only the frequency sample in which the interference shows, i.e. the cut level is exceeded, but also one or more neighbouring frequency samples depending on the sampling frequency being used. For instance, at a 16 MHz sampling frequency and with a 960,000-point sample string, the width of one frequency sample corresponds to approximately 16.7 Hz. If the width of the interference to be removed is 9 kHz, the number of frequency samples to be nulled is 540, i.e. 270 samples on both sides of the sample exceeding the cut level. The result is the corrected spectrum $G(j\omega)_1$. FIG. 6 shows an adjusted amplitude spectrum $|G(j\omega)|_o$ and the first cut level 61. For defining 107 the cut level of low peaks, the amplitude values exceeding the cut level 61 are also nulled 106 in the adjusted amplitude spectrum, in which case block 107 uses the corrected adjusted amplitude spectrum $|G(j\omega)|_k$ for defining the second cut level 71. The correction of the adjusted amplitude spectrum alters (makes smaller) its average and standard deviation, and the definition of the second cut level can be made more accurately in the second cutting. If more than two cuttings were used, the amplitude spectrum used in defining 105 and 107 the cut level would also be corrected correspondingly with each spectrum correction 106. The correction of the amplitude spectrum is not made with the last spectrum correction 108, because the amplitude spectrum will not be needed later. Removing 108 low peaks from the spectrum is done correspondingly, i.e. the frequency ranges having values exceeding the cut level 71 of the low peaks in the corrected adjusted amplitude spectrum $|G(j\omega)|_k$ are nulled in the corrected spectrum $G(j\omega)_1$. FIG. 7 shows the corrected adjusted amplitude spectrum and the second cut level 71. The result is thus the spectrum $G(j\omega)_2$ from which peaks have been removed at two different stages. The amplitude spectrum $|G(j\omega)_2|$ corresponding to this corrected spectrum $G(j\omega)_2$ is shown in FIG. 8. As a result of the filtering, low peaks caused by narrow-band interference often remain in the amplitude spectrum, but if the width and height of the peak is taken into account, it can be noted that the power of the interfering pulse is very low. FIG. 9 shows the corrected signal $g(t)_2$ in a time domain, obtained by transforming 109 the twice corrected 106 and 108 spectrum, i.e. signal, $G(j\omega)_2$ from the frequency domain back to the time domain. The narrow-band interference remaining in the signal are: considerably lower than the background noise, so distinguishing interference in the time domain (FIG. 9) is almost impossible.

Eliminating asynchronous impulse interference 121

The operation of a method of eliminating asynchronous impulse interference is based on the fact that the typical properties of a partial discharge pulse and asynchronous interfering pulses differ from each other enough to make distinguishing them possible. Partial discharge pulses occur in pulse groups in areas of cycle depending on the discharge type, and there is deviation in the location and amplitude of a single pulse, whereas asynchronous impulse interference occurs at almost equal intervals, at nearly a constant amplitude and during the entire cycle.

Figures 11, 13:
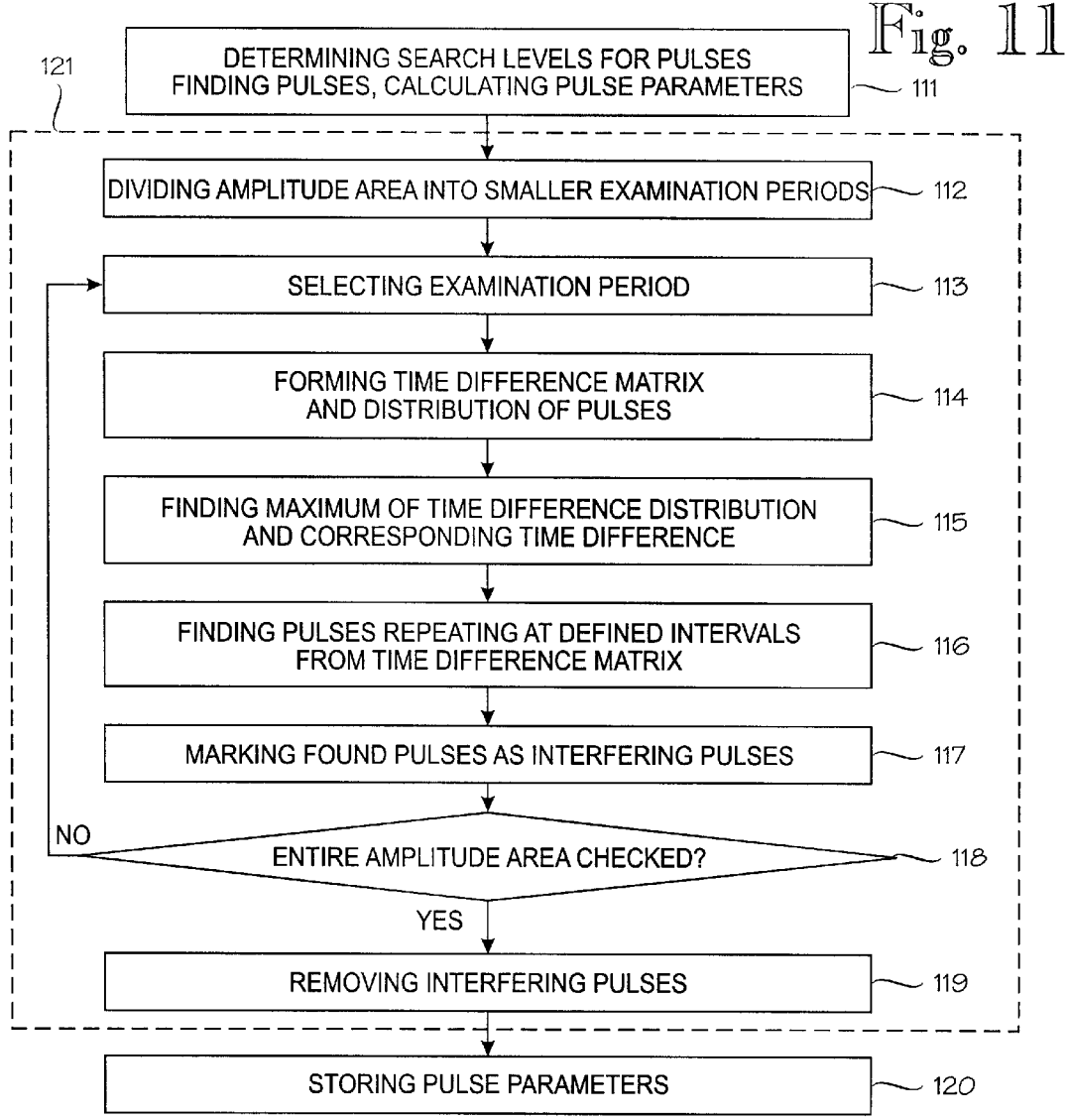
FIG. 11 shows a block diagram of a method of eliminating asynchronous impulse interference.
FIG. 13 shows the basic structure of a time difference matrix.

As starting data, the method uses pulse parameters obtained by finding the pulses occurring in a partial discharge measuring signal and calculating and storing the following information on them: amplitude, starting phase angle, cycle number, rise time, fall time, width and area of the pulse. In the measurements used as examples, data was measured during three network cycles (60 ms with 50 Hz frequency) and in the earlier phases, the amplitude of the pulses was scaled to between 0 and 128. No limits are set to the number of pulses. During one cycle, there are assumed to be 5 to 500 asynchronous interfering pulses and consequently, the time difference of consecutive interfering pulses is assumed to vary between 0.04 and 4 ms. The flow chart of the method is shown in FIG. 11.

Figure 14:
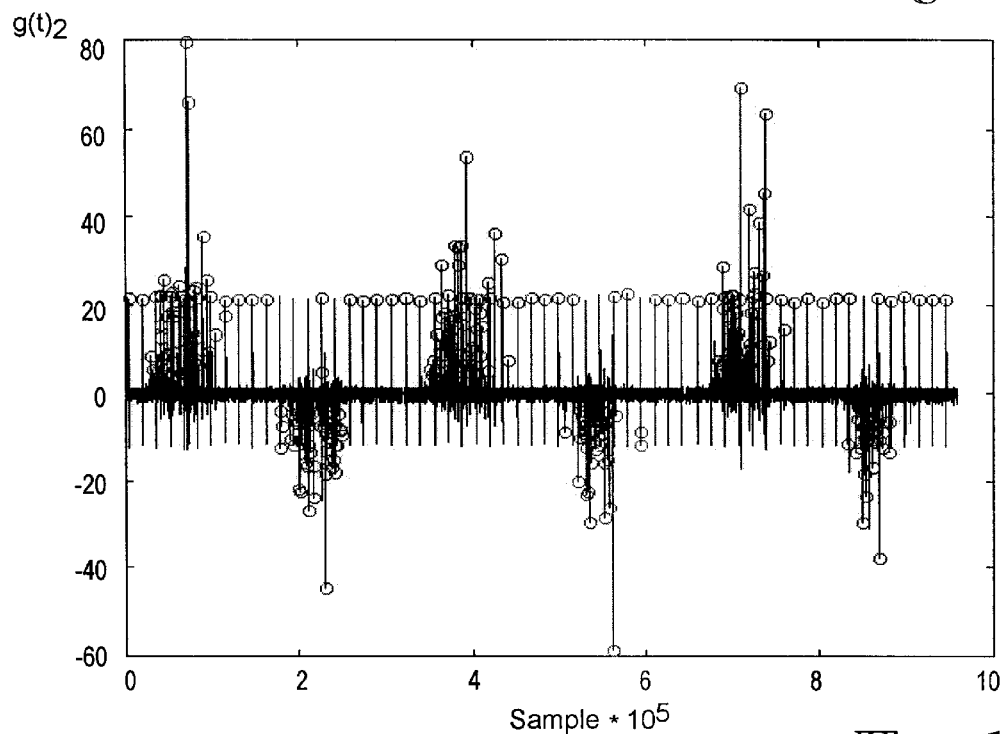
FIG. 14 shows an interfering exemplary signal.
Figure 15:
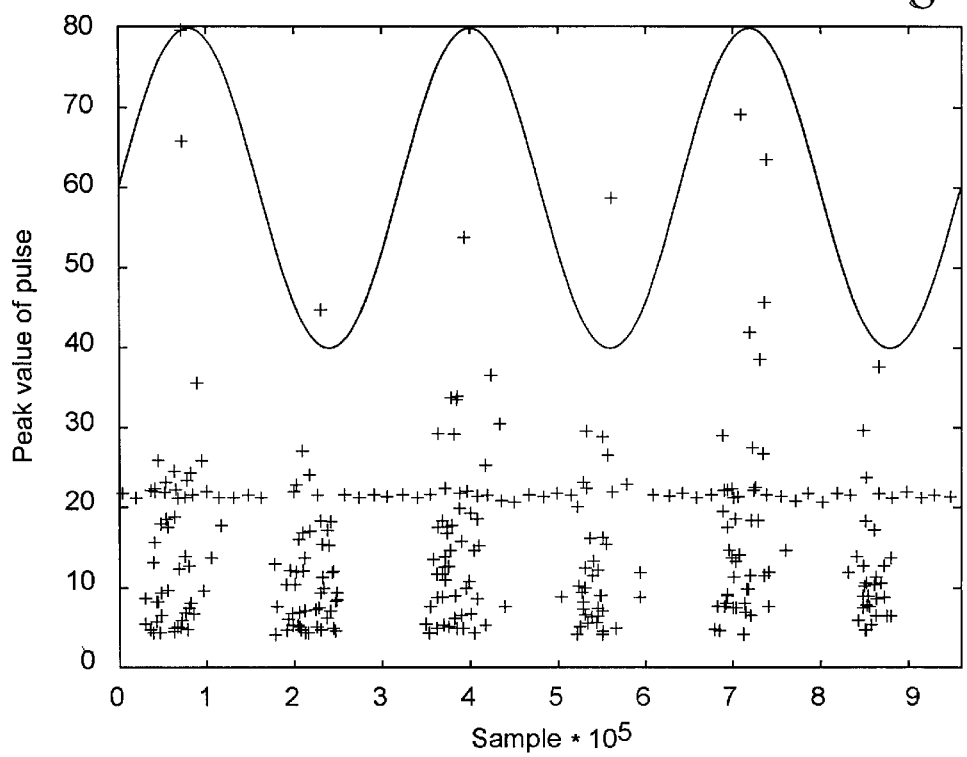
FIG. 15 shows the peaks detected in the exemplary signal.

At the pulse search and pulse parameter calculation stage 111, the pulses occurring in the measuring signal are found and pulse parameters (e.g. amplitude, phase angle and cycle number) are defined for the pulses. FIG. 14 shows a partial discharge measuring signal. The peaks of the pulses found in the signal have been circled. The pulse parameters of the found pulses are used as the starting data. FIG. 15 shows the peaks of the found pulses in time order. In FIGS. 14 and 15, the X axis represents the samples, and thus in the case described herein, one sample corresponds to 62.5 ns. FIG. 15 also shows a 50 Hz sine wave to illustrate the location of the pulses in the phase voltage more clearly. The string of asynchronous interfering pulses is shown in FIG. 15 as a string in the amplitude area 20 to 25.

Figure 12:
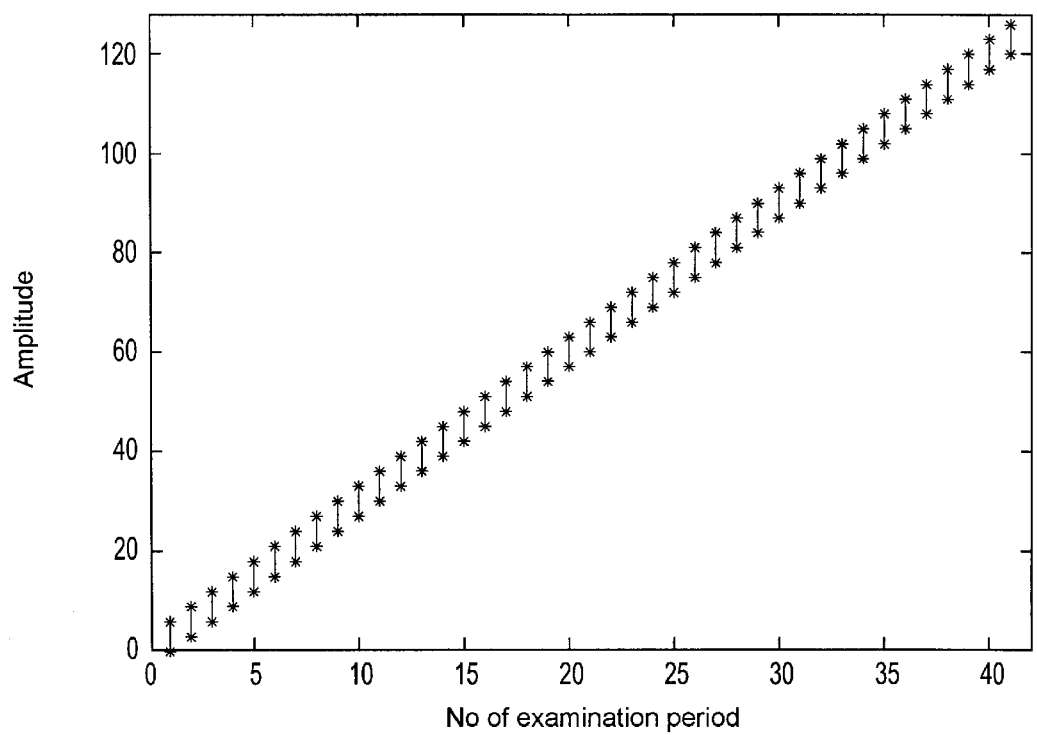
FIG. 12 shows the division of an amplitude area.

The amplitude area (0 to 128) is preferably divided (step 112) into 41 examination periods, as shown in FIG. 12. The amplitude deviation, i.e. length of the period, is preferably ±3. The periods are examined 113 one by one and only the impulses, whose amplitude is within the period, are examined at each time. The amplitude area is divided into smaller examination periods so as to be able to examine the time, difference between pulses of certain amplitudes. By changing the amplitude deviation and the number of examination periods, it is possible to change the maximum allowed amplitude deviation of asynchronous impulse interference. When the examination periods overlap somewhat, all asynchronous interferences can be detected regardless of their amplitude and amplitude deviation.

By means of the information on the;; starting phase angle of the pulse and the cycle number, it is possible to calculate the time difference of equal-amplitude pulses to the pulses preceding them (for instance, the pulse peaks in FIG. 15 are set in place using the information on phase angle and cycle number). The information is stored 114 in the time difference matrix. FIG. 13 shows the basic structure of the matrix. Each vertical line shows the time difference of the pulses in question to the pulses preceding them, for instance line 5, column 8 shows the time difference of the fifth and eighth pulse. The time difference matrix contains the time difference (i.e. distance) of each pulse to all pulses preceding it within in the same examination period.

Figure 16:
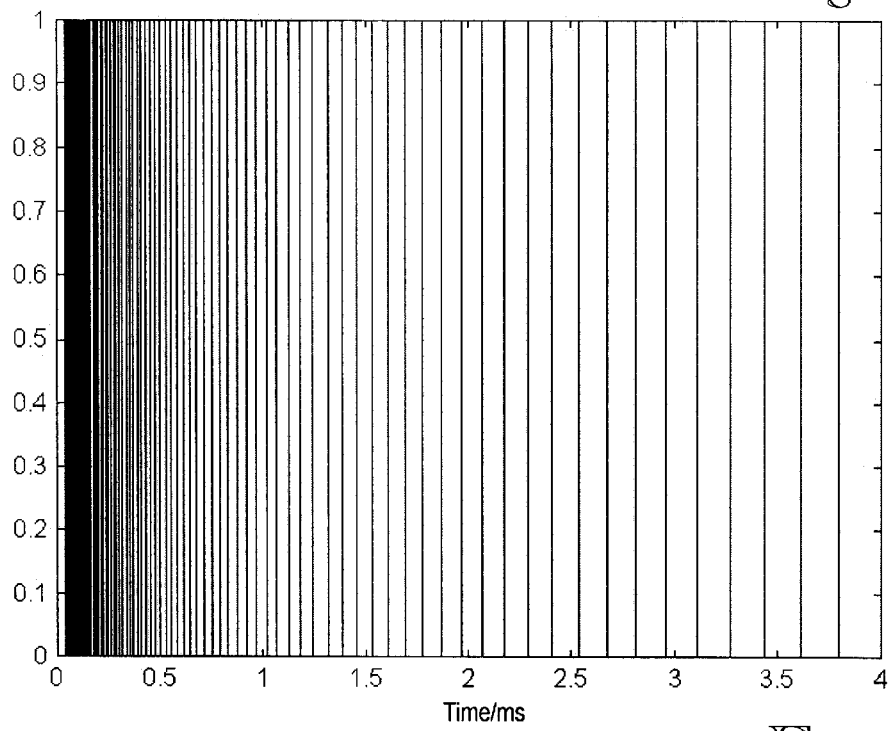
FIG. 16 shows the distribution of the blocks of the time difference distribution.

Simultaneously with making the time difference matrix, a time difference distribution is created 114. The distribution is formed in the range of 0.04 to 4 ms, for instance. The distribution is preferably divided into 91 logarithmic blocks so that the step from one block to another is 5.2%. At the location of the time difference in question, the value time difference/20 is added to the distribution and, on both sides of the time difference, the value (time difference/20)2. FIG. 16 shows the division of the blocks of the time difference distribution. The size of the blocks increases from left to right. The distribution is formed of the time difference between consecutive pulses in the same examination period (i.e. the time difference of the pulse to the pulse preceding it). In practice, the values from which the distribution is formed are immediately above the diagonal axis of the time difference matrix.

Figure 17:
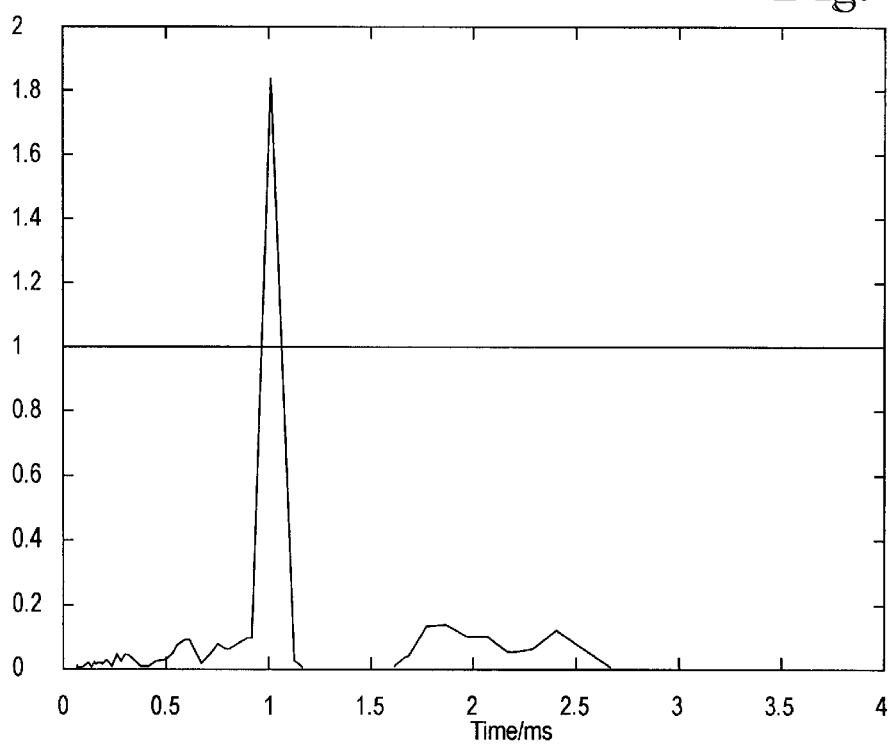
FIG. 17 shows a time difference distribution formed for the exemplary signal.

FIG. 17 shows a time difference distribution formed for the exemplary partial discharge signal mentioned earlier in an examination period of 21±3. The distribution shows a strong peak at approximately 1 ms and the peak is higher than the value 1 set as the threshold, and consequently on the basis of the distribution, it can be noted that the signal has asynchronous impulse interference at 1 ms (16,000 samples) intervals.

The value time difference/20 is a density index. The sum of indexes which is finally obtained from the distribution, depicts the seriousness of the situation in a way. As the description will later show, so as to have the pulses occurring at 0.2 ms intervals occur "as often" as the pulses occurring at 1 ms intervals, there must be five times as many pulses occurring at 0.2 ms intervals. The height of the peak in the distribution shown in FIG. 17 is approximately 1.8. The peak value for three cycles is 3, so the peak shows that over a half of the pulse pairs occurring at 1 ms intervals have been detected. The time difference of consecutive pulses only is stored in the distribution.

The fact that the values (time difference/20)2 are added in the distribution to neighbouring locations of the found time difference, endeavours to round the distribution and to ensure that also the time differences that are at the border of two blocks will be detected.

The value time difference/20 means that the value 1 will be obtained for the distribution, if the cycle has 20 pulses at 1 ms intervals or 100 pulses at 0.2 ms intervals. The distribution thus shows the time difference at which interval equidistant pulses occur proportionally the most.

When the time difference information has been calculated for each equal-amplitude pulse, the maximum of the time difference distribution is found 115 and the time difference with which it is realised. If the peak value of the time difference distribution is higher than a pre-set threshold value, pulses repeating at equal intervals in the time difference matrix are searched for. A three-cycle long measurement uses the value 1 as the threshold value. This requires that when forming the time difference distribution, at least every third of the repeating pulse pairs have been detected. The threshold value should not be set too high, because it may happen that there are both partial discharge pulses and interfering pulses in the same examination period. It is not always possible to obtain the time difference between two interfering pulses at partial discharge groups, but it is probable that a time difference between a partial discharge pulse and an interfering pulse is obtained. The threshold value is, however, so high that partial discharges do not exceed it. Not even the pulse strings of a corona discharge are "long" enough to be interpreted as interference. The value time difference/20 scales the distribution so that the highest possible value of the distribution corresponds to the number of cycles. If there were samples from one network cycle only, the peak value would be 1. In the example, three network cycle long packets are examined, and the peak value of the distribution is 3.

Figure 18:
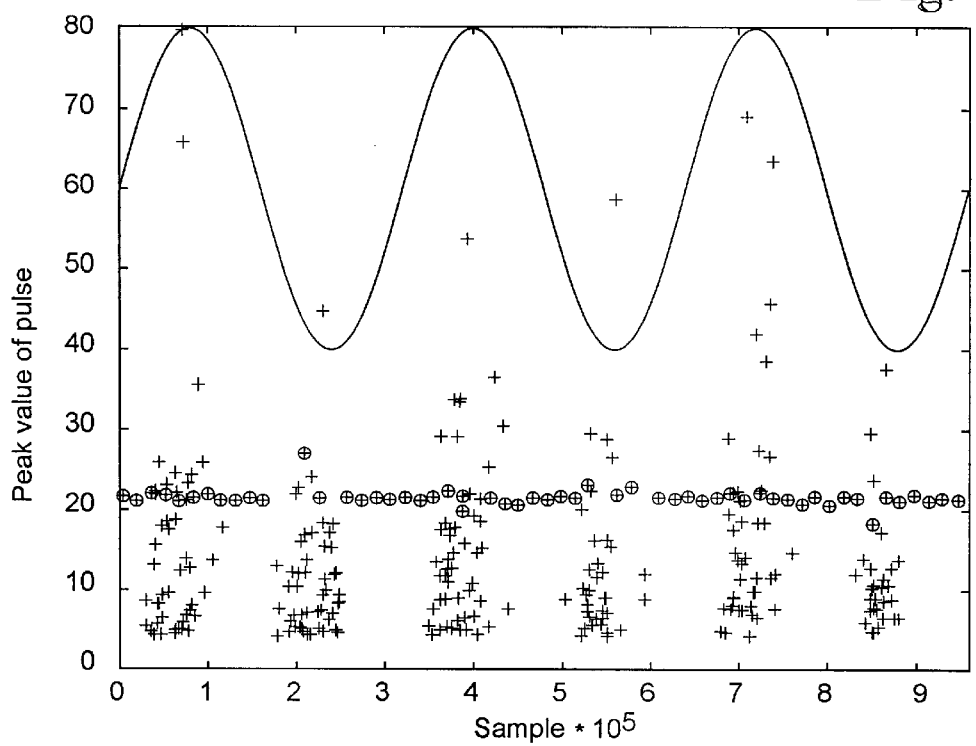
FIG. 18 shows the interfering pulses detected in the exemplary signal.

Finding 116 pulses that repeat at equal intervals in the time difference matrix is done as follows. The search is started using pulse 1 as the first pulse. From the first horizontal line a value is searched which is within the range:

$$k.AE-0.135.AE \leq \text{Value} \geq k.AE+0.135.AE$$

wherein AE is the time difference between repeating pulses, obtained from the time difference distribution and k is 1, 2, 3 . . . FIG. 20 shows the values of a time difference matrix for the first 31 pulses. The time difference between repeating pulses is 1 ms in the example. In this case, the value meeting the conditions is found on line 1, location 22 of the matrix. The pulse index is stored so that it can be marked as an interfering pulse, if the found pulse string meets the conditions set for it. The pulse search is now continued from line 22. A value meeting the conditions cannot be found in this table and it can be noted later that several pulses are missing from the found pulse string, i.e. it is not uniform enough to be an interfering pulse string. The search is then started from the beginning using pulse 2 as the first pulse. A value meeting the conditions is searched for on the $2^{nd}$ vertical line. It is found at location 3. The pulse index is stored and the search is continued on line 3. A suitable value is found at location 5, the index is stored and the search is continued on line 5. A value which is within. the desired range when k=1 is searched for on line 5. Such a value is found at location 7 and the search is continued on line 7. If the pulse at location:7 had not been found and the location in question had had the value 1.2 for instance, it would be noted here that when k=1, there is no value meeting the conditions on this line, since the values increase from left to right on the lines. The value of k would then be increased by one and the search continued from this location onward. A value meeting this condition would be found in location 10 and the search continued on line 10. Always when starting to search for the next interfering pulse, the value of k is set to 1. If an interfering pulse cannot be found, the value of k is increased by one. When the time difference of. interfering pulses obtained from the distribution is 1 ms, for instance, a pulse string is searched for from the time difference matrix, whose time difference between pulses is k×1 ms±0.135 ms. The interfering pulses found in the: exemplary signal are circled in FIG. 18.

When the entire pulse set has been examined, a check is made to see whether the pulse string is sufficiently uniform. The condition is preferably that at least half of the pulses have been found. If the pulse string is sufficiently uniform, the pulses in it are marked 117 as interfering pulses. The number of found interfering pulses can easily be calculated and the maximum number of interfering pulses occurring at intervals of certain time differences can also be calculated by means of the time difference and the sampling time by dividing the sampling time by the time difference between the pulses. In other words, in the three-cycle long measurement and the 1-ms time difference used in the example, this is (3×20 ms)/1 ms=60 pulses. Thus, if in this case, more than 30 interfering pulses are found, the pulse string is sufficiently uniform.

Figure 19:
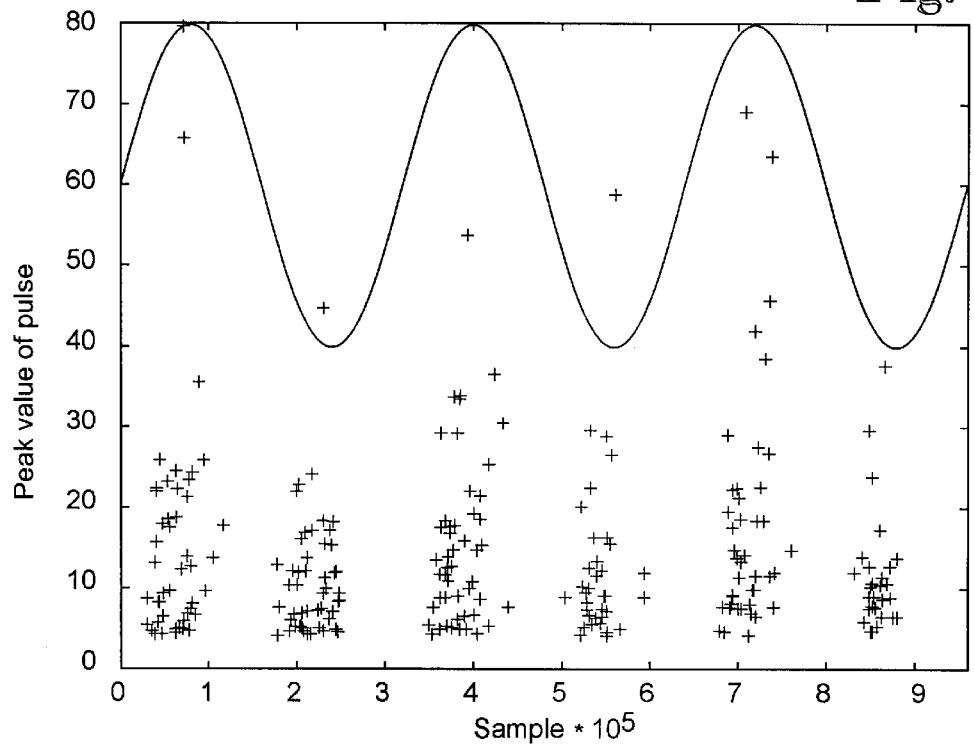
FIG. 19 shows an exemplary signal from which interfering pulses have been eliminated, FIG. 20 has an example of a time difference matrix.

When all examination periods have been examined 118, all pulses occurring within the amplitude area are checked and the pulse parameters of the pulses that have been marked as interfering pulses are removed 119 from the database. FIG. 19 shows an exemplary signal from which all detected interfering pulses have been removed. The following parameters, for instance, can be changed in the method: amplitude deviation, number of examination periods, time difference deviation and number of searched asynchronous interfering pulses. Further, the time difference matrix can be replaced by calculating only the values immediately above its diagonal, i.e. by defining the time difference of consecutive pulses. The time difference between two pulses can be calculated using these values, but the calculation becomes more complicated.

Eliminating synchronous impulse interference 200

The operation of a method of eliminating synchronous impulse interference is based on the fact that the typical properties of a partial discharge pulse and synchronous interfering pulses differ from each other enough to make distinguishing them possible. Partial discharge pulses occur in pulse groups in areas of cycle depending on the discharge type, but there is deviation in the location and amplitude of a single pulse, whereas synchronous impulse interference occurs at nearly the same phase angle and at nearly constant amplitude.

As starting data, the method preferably uses pulse parameters obtained by finding the pulses occurring in a partial discharge measuring signal and calculating and storing 120 the amplitude, starting phase angle, cycle number, rise time, fall time, width and area of the pulse. In the earlier phases, the amplitude of the pulses was scaled to between 0 and 128. The number of synchronous interfering pulses during one cycle is assumed to vary case by case. The flow chart of the method is shown in FIG. 21.

The amplitude area (0 to 128) is divided (step 201) into smaller examination periods like in connection with asynchronous impulse interference elimination. The amplitude area is, for instance, divided into 20 partly overlapping examination periods and the width of a period is ±0.055×the amplitude of the largest pulse in the pulse series. The examination periods are examined 202 one at a time and only the pulses are examined, whose amplitude is within the period.

First a phase angle distribution of the pulses is formed 203 by checking all pulses in the same examination period and forming the distribution from their starting phase angles. The distribution is divided into 180 blocks, for instance, in relation to the phase, i.e. the width of one block corresponds to 2°. When forming the distribution, one should also take into consideration the other pulses occurring in the same cycle. Forming the distribution is started from the first measured cycle and the first block of the distribution, i.e. phase angles 0 to 2°. The value 1 is added to the first block of the distribution, if in the first cycle, only one pulse occurs in said block and no pulses occur within two blocks of the examined block, i.e. phase angles 2 to 6°. If the fifth block, for instance, were examined, i.e. phase angles 8 to 10°, there should be no pulses at the phase angles 4 to 8° and 10 to 14°. If there are more than one pulse in the block or if there are pulses in the neighbouring blocks, the value of the distribution is not changed. This action endeavours to prevent the elimination of partial discharge pulses. Even though partial discharge pulses are quite irregular, it is possible that, in the middle of pulse groups, pulses occur so densely that some of them may be identified as synchronous impulse interference. The drawback in this is that synchronous interfering pulses occurring at the same phase angles as partial discharges cannot necessarily be identified. The obtained distribution is rounded by summing the values of the neighbouring blocks to each block.

Before finding the peaks 204, the phase angle distribution is normed by dividing its values by the number of cycles. Any values higher than 0.4 are interpreted 204 as peaks of the phase angle distribution. If peaks are detected, the pulses are re-examined and the pulses occurring at phase angles corresponding to the peaks are marked 205 as interfering pulses. The marking as interfering pulses is, however, done so that only one pulse per cycle is marked as an interfering pulse in one phase window. Thus, if one phase window has both a partial discharge pulse and an interfering pulse, at least one of them will be analysed.

When all examination periods have been examined 206, all pulses within the amplitude area are checked and the pulse parameters of the pulses that are marked as interfering pulses are removed 207 from the database. In the method, the following parameters, for instance, can be changed: amplitude deviation, number of examination periods and threshold value of peak search.

Analysing partial discharges 300

Measurements are made until there: is at least a certain number 122 of collected pulses which herein is called the analysis limit. The analysis limit is a thousand pulses, for instance. A collected group of for instance a thousand pulses is in the following called a sample.

One or more characteristic parameters are defined 301 of the collected pulses. The characteristic parameters may correspond to the pulse parameters defined 111 earlier from the pulses, in which case the values of the corresponding pulse parameters are defined as the values of the characteristic parameters. According to a preferred embodiment of the invention, the following three characteristic parameters are defined:

Characteristic parameter Tr (rise time) shows the rise time of the pulse measured from the rise side of the pulse, for instance between the 10% and 90% points.

Characteristic parameter Tf (fall time) shows the fall time of the pulse measured from the fall side of the pulse, for instance between the 90% and 10% points.

Characteristic parameter Tw (width of the pulse) shows the width of the pulse measured from between the rise and fall sides of the pulse, for instance between the 50% points.

It should be noted that other characteristic parameters can also be used without this having any significance with respect to the basic idea of the invention. Other possible characteristic parameters are the surface area and the peak value of the pulse, for instance.

When the characteristic parameters have been defined, the average of the values defined from different pulses of each characteristic parameter is preferably calculated. The averages of the characteristic parameters are placed 302 in a model, which is described later in greater detail and which depicts the change of the pulse parameters (characteristic parameters) as a function of distance substantially at the frequencies where partial discharge pulses occur. An estimate on the distance of the discharge point from the measuring point is obtained 303 as a result. Alternatively, it is possible to first place the characteristic parameters of each pulse into the model and then calculate the averages from the results obtained from the model.

A model corresponding to the electric system can be defined on the basis of practical measurements, for instance. FIG. 24 shows a flow chart of forming the model. The model can be formed either directly for the entire electric system or first for its parts and then for the entire system by combining the models of the parts. Models can be formed in advance for certain standard components used in electric systems, such as for different cable types, in which case the model of an electric system comprising such standard components can easily be made on the basis of the information on the standard components, and there is no need to separately measure the electric system for forming the model. Forming the model of an electric system or its component is done as follows: placing 501 a partial discharge source in the object being examined at various distances, from the measuring point and defining 502 from the partial discharge pulses at the measuring point one or more characteristic parameters depicting the properties of the pulses in the same manner as described above in connection with the analysis phase. This is repeated 503 using a sufficient number of distances. One or more graphs on the changing of the characteristic parameters as a function of distance can be formed by means of the defined characteristic parameters. By means of the graphs it is then possible to form 504 a model on the changing of the characteristic parameters as a function of distance.

The model can be based on a polynome, for instance. The general form of a polynome is, for instance:

$$h(u)=v_n u^n + v_{n-1} u^{n-1} + \ldots + v_1 u + v_0 \text{ and } v_n \neq 0,$$

wherein h=distance of the partial discharge source from the measuring point, u=characteristic parameter $v_n \ldots v_0$=coefficients of the polynome, and n=order of the polynome.

The polynome is matched to said graphs for each used characteristic parameter u, the graphs depicting the changing of the characteristic parameters as a function of the distance between the partial discharge source and the measuring point. Matching the polynome to the graph can be done according to generally known principles and will not be described in more detail herein. The order of the polynomes matched to the graphs is set in such a manner that the error remaining in the model remains within desired limits, for instance under 100 m. Thus, there are as many polynomes as used characteristic parameters. The model is, for instance, formed of the polynomes ($h_{rise\ time}$, $h_{fall\ time}$ and $h_{pulse\ width}$) of the rise time, fall time and pulse width characteristic parameters. Each polynome produces its own distance estimate and these, for instance three, distance estimates are combined as the final result $h_{estimate}$ by finding preferably the mid-sized value, i.e. the median of the group:

$$h_{estimate} = \text{median}(h_{rise\ time}, h_{fall\ time}, h_{pulse\ width}).$$

If three characteristic parameters are used and consequently, three estimates, this method provides the possibility to prevent the effect of one clearly erroneous estimate ($h_{rise\ time}$, $h_{fall\ time}$ or $h_{pulse\ width}$) on the final estimate $h_{estimate}$. To obtain accurate and reliable results with the method, the orders and coefficients of the polynomes must be defined separately for each electric system or its component on the basis of practical measurements, as already stated above.

The performance of the method can be influenced by selecting another model structure, such as the ARMA model (AutoRegressive-Moving Average), or by basing the model on a neural network or by defining a physical model affecting the behaviour of each characteristic parameter. Combining the results can also be performed by alternative means without deviating from the basic idea of the invention.

It should be noted that what is presented above is only one possible form of application of the invention. The method and system of the invention can be altered from what is described herein for instance as follows: changing the medium frequency and bandwidth of the measuring band (the medium frequency can also be considerably higher than: the bandwidth), setting the medium frequency by program by adding in front of the digitising chain a mixer and a local oscillator whose frequency can be set by program, setting the bandwidth by program, changing/adding characteristic parameters, weighting different characteristic parameters and the distance estimates obtained by them by specific weighting coefficients. Further, it is possible to use fuzzy logic in forming the distance estimate, or the method can be combined with a TDR method, such as level crossing, auto-correlation, matched filter and cross-correlation.

It is obvious to a person skilled in the art that while technology advances, the basic idea of the invention can be implemented in many different ways. The invention and its embodiments are thus not restricted to the examples described above, but can vary within the scope of the claims.

What is claimed is:

1. A method of determining the location of partial discharge sources in an electric system, the method comprising:

measuring a variable of the electric system, such as voltage or current, to which partial discharges occurring in the electric system cause pulses, separating the pulses caused by partial discharges occurring in the measured variable, defining one or more characteristic parameters depicting the properties of partial discharge pulses for each partial discharge pulse after at least a predefined number of partial discharge pulses has been obtained, and determining the location of the partial discharge source by inserting the obtained characteristic parameters in a model formed in advance, which depicts the dependency of the values of the characteristic parameters from the distance between the partial discharge source and the measuring point where the characteristic parameters have been defined on the basis of the measured variables.

2. A method as claimed in claim 1, wherein the location of the partial discharge source is determined (302) by placing into said model the value best representing the values defined from two or more pulses of each characteristic parameter.

3. A method as claimed in claim 2, wherein the characteristic parameters defined for each partial discharge pulse comprise at least one of the following: rise time Tr showing the rise time of the pulse, fall time Tf showing the fall time of the pulse, and pulse width Tw showing the width of the pulse.

4. A method as claimed in claim 2, wherein said value best representing the values defined from two or more pulses of each characteristic parameter is the average of the values.

5. A method as claimed in claim 4, wherein the characteristic parameters defined for each partial discharge pulse comprise at least one of the following: rise time Tr showing the rise time of the pulse, fall time Tf showing the fall time of the pulse, and pulse width Tw showing the width of the pulse.

6. A method as claimed in claim 1, wherein the characteristic parameters defined for each partial discharge pulse comprise at least one of the following: rise time Tr showing the rise time of the pulse, fall time Tf showing the fall time of the pulse, and pulse width Tw showing the width of the pulse.

7. A method as claimed in claim 1, wherein forming said model comprises:

setting the partial discharge source at least two different distances from the measuring point, measuring the partial discharge pulses produced by the partial discharge source at various distances in the measuring point, defining one or more characteristic parameters depicting the properties of partial discharge pulses for each partial discharge pulse, forming graphs on the changing of the values of the characteristic parameters as a function of the distance between the measuring point and the partial discharge source, and forming a model on the basis of the graphs.

8. A method as claimed in claim 7, wherein models are formed separately for each part or different type of part of the electric system, whereby a model corresponding to the entire electric system is formed by combining the models of its parts.

9. A method as claimed in claim 7, wherein said model is of polynome form.

10. A method as claimed in claim 1, wherein said model is of polynome form.

11. An arrangement for determining the location of partial discharge sources in an electric system, the arrangement comprising:

measuring means arranged to measure a variable of the electric system, such as voltage or current, to which partial discharges occurring in the electric system cause pulses, separate the pulses caused by partial discharges occurring in the measured variable, and analysing means arranged to define one or more characteristic parameters depicting the properties of partial discharge pulses for each partial discharge pulse after at least a predefined number of partial discharge pulses has been obtained, the analysing means are also arranged to determine the location of the partial discharge source by placing the obtained characteristic parameters in a model formed in advance, which depicts the dependency of the characteristic parameter values from the distance between the partial discharge source and the measuring point where the characteristic parameters have been defined on the basis of the measured variables.

12. An arrangement as claimed in claim 11, wherein the analysing means are also arranged to determine the location of the partial discharge source by placing into said model the value best representing the values defined from two or more pulses of each characteristic parameter.

13. An arrangement as claimed in claim 12, wherein the characteristic parameters defined for each partial discharge pulse comprise at least one of the following: rise time Tr showing the rise time of the pulse, fall time Tf showing the fall time of the pulse, and pulse width Tw showing the width of the pulse.

14. An arrangement as claimed in claim 12, wherein said value best representing the values defined from two or more pulses of each characteristic parameter is the average of the values.

15. An arrangement as claimed in claim 4, wherein the characteristic parameters defined for each partial discharge pulse comprise at least one of the following: rise time Tr showing the rise time of the pulse, fall time Tf showing the fall time of the pulse, and pulse width Tw showing the width of the pulse.

16. An arrangement as claimed in claim 11, or wherein the characteristic parameters defined for each partial discharge pulse comprise at least one of the following: rise time Tr showing the rise time of the pulse, fall time Tf showing the fall time of the pulse, and pulse width Tw showing the width of the pulse.

17. An arrangement as claimed in claim 11, wherein said model is of polynome form.

* * * * *